(12) United States Patent
Stanick et al.

(10) Patent No.: US 7,133,272 B2
(45) Date of Patent: Nov. 7, 2006

(54) SOLID-STATE REPLACEMENT FOR LOCOMOTIVE RELAY

(76) Inventors: Steve R. Stanick, 24603 W. Guinevere La., Joliet, IL (US) 60431; Michael A. Meyers, 536 Parkview La., Apt. 5, Joliet, IL (US) 60431

( * ) Notice: Subject to any disclaimer, the term of this patent is extended or adjusted under 35 U.S.C. 154(b) by 270 days.

(21) Appl. No.: 10/798,416

(22) Filed: Mar. 12, 2004

(65) Prior Publication Data

US 2005/0201037 A1   Sep. 15, 2005

(51) Int. Cl.
*H01H 9/00* (2006.01)
(52) U.S. Cl. .......................... 361/160; 361/18; 361/100; 361/102
(58) Field of Classification Search ................ 361/160, 361/100, 101, 18
See application file for complete search history.

(56) References Cited

U.S. PATENT DOCUMENTS

| | | | | |
|---|---|---|---|---|
| 3,805,056 A | * | 4/1974 | Birkin | ..................... 246/187 B |
| 5,016,840 A | * | 5/1991 | Bezos | ..................... 246/187 R |
| 5,200,878 A | * | 4/1993 | Sasagawa et al. | ............ 361/98 |
| 5,222,492 A | | 6/1993 | Morgan et al. | ................. 607/5 |
| 5,347,166 A | * | 9/1994 | Schauder | ..................... 307/113 |
| 5,463,252 A | * | 10/1995 | Jones et al. | .................. 257/723 |
| 5,537,285 A | * | 7/1996 | Jenets et al. | ................. 361/100 |
| 5,594,287 A | * | 1/1997 | Cameron | ................ 307/132 E |
| 5,699,218 A | | 12/1997 | Kadah | .......................... 361/13 |

FOREIGN PATENT DOCUMENTS

| | | |
|---|---|---|
| EP | 0 246 064 A2 | 11/1987 |
| EP | 0 326 290 A1 | 8/1989 |
| EP | 0 546 666 A2 | 6/1993 |

\* cited by examiner

*Primary Examiner*—Stephen W. Jackson
*Assistant Examiner*—Terrence Willoughby
(74) *Attorney, Agent, or Firm*—Richard C. Litman

(57) ABSTRACT

A solid-state direct replacement relay assembly, and a method for installing and using it to replace the mechanical-style relays in the electrical cabinets of a locomotive. Solid-state relay components are substituted to upgrade locomotive relay systems, and to improve train controls. Normally solid-state relays cannot directly handle standard locomotive voltages without an external power supply that requires modification to the original train design and wiring. The solid-state relay assembly is coupled to a D.C./D.C. converter, which steps 75 volts down to approximately 5–32 volts, and is used to control the solid-state relay assembly. The use of the solid-state relay assembly device requires no modification to the existing electrical wiring system of any new or old locomotive.

2 Claims, 4 Drawing Sheets

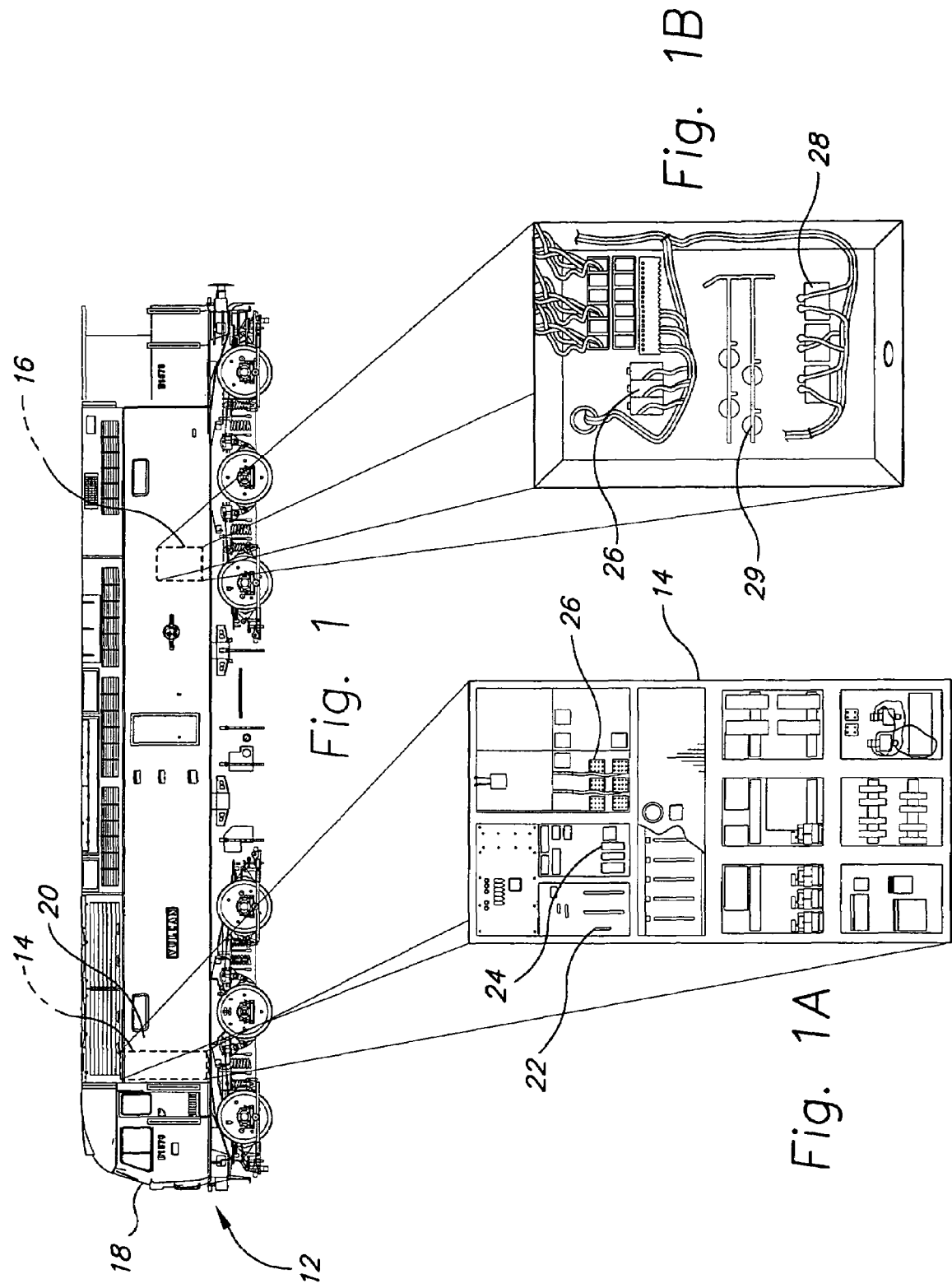

SOLID-STATE REPLACEMENT FOR LOCOMOTIVE RELAY

BACKGROUND OF THE INVENTION

1. Field of the Invention

The present invention relates to solid-state relays. More specifically, the invention is a solid-state relay device and a method for its installation in a locomotive electrical cabinet.

2. Description of the Related Art

Solid-state relay technology has been present 15 years approximately in the general industry in association with alternating current sources or low control side voltages, and the technology has been employed in computerized trains for purposes such as microprocessing, but only in association with relatively low control side voltages. However, solid-state relays have not been used to handle the high control side voltages found in the main electrical cabinets of locomotives in which standard locomotive voltage, such as 74 volts on the load side and the control side, is the norm. Solid-state relays have traditionally been operable at 5 to 32 volts on the control side. The problem is that solid-state technology is lagging behind for applications involving standard locomotive voltages. A DC to DC power converter employed with the present invention is a key feature that enables the use of solid state technology in a locomotive electrical system at standard locomotive voltages. Typically, the properties inherent in AC better lend themselves to solid-state technology, because AC creates a less harsh electrical environment, i.e., it is not as demanding on the components. Thus, AC is favored within the solid-state industry as a whole. DC to DC power conversion had been performed in the solid-state industry, but not with high voltages such as those found in a locomotive.

Most all locomotives typically use mechanical relays to switch power to various loads. These mechanical relays are typically housed in a compartment in the main electrical cabinet of the locomotive. The problem with mechanical relays is that they are subject to failure through mechanical wear and tear. The switch contacts become worn, pitted, or develop a coating of carbon, leading to arcing and other transient problems. Solid-state relays offer certain advantages over mechanical relays, including faster switching times, greater reliability, and longer service life. However, the mechanical relays in older locomotives cannot be replaced directly by solid-state relays, since the mechanical relays were designed to operate on the locomotive's standard 74-volt DC electrical system, whereas solid-state relays require a power supply between 5–32 volts. Until the present invention, replacing mechanical relays with solid-state relays would require an external 5–32 volt power supply, which requires additional cost, and which requires additional space, as it could not fit in the existing main electrical cabinet. The present invention offers a solution by offering a retrofit solid-state relay assembly which uses DC-DC converters to operate from the locomotive's existing 74 volt electrical system, the assembly being configured to replace the mechanical relays in the main electrical cabinet.

The related art describes various components of an electrical circuit suitable for operating locomotive switches, but none discloses the present invention. The related art will be discussed in the perceived relevance to the present invention.

U.S. Pat. No. 5,537,285 issued to Robert J. Jenets et al. (Jenets hereinafter) on Jul. 16, 1996, describes a solid-state relay module suitable for accepting low-level digital signals from a digital computer, and for providing on/off control of heavy electrical loads. The relay and its methods are intended for electrically hostile environments, such that the relay may be exposed to spurious high voltages either on its input or on its load circuit. The relay and its methods are particularly intended for use in a locomotive throttle controller. The relay accepts low-level digital signals from a central processor computer in the throttle controller, and provides high power digital signals to the train lines that control the engine of the locomotive. The controlling signal for the Jenets' relay is a relatively low-voltage, low-power signal originating in a digital computer. Thus, the Jenets' device cannot be operated by standard locomotive voltages. Jenets' device is a transient voltage protection (snubber) circuit. It is essentially a solid-state relay device requiring a thyristor, but not a solid-state relay device in combination with a DC/DC power converter. Jenets' device is distinguishable for lacking the capability for operating on standard higher locomotive voltages.

U.S. Pat. No. 5,347,166 issued to Colin D. Schauder on Sep. 13, 1994, describes a valve for rapidly switching high voltage at high currents. The valve is distinguishable for its limited single operation.

U.S. Pat. No. 3,805,056 issued to Michael S. Birkin on Apr. 16, 1974, describes a vehicle control system for a vehicle moving along a track way. Birkin does not describe the present invention as claimed.

U.S. Pat. No. 5,016,840 issued to Angel P. Bezos on May 21, 1991, describes an end-of-train emergency arming apparatus and method for its use. Bezos does not describe the present invention as claimed.

U.S. Pat. No. 5,200,878 issued to Kiyoaki Sasagawa et al. on Apr. 6, 1993, describes a drive circuit for a current sense Insulated Gate Bipolar Transistor. Sasagawa et al. do not describe the present invention as claimed.

U.S. Pat. No. 5,222,492 issued to Carlton B. Morgan et al. on Jun. 29, 1993, describes a cardiac defibrillator including an electronic energy transfer circuit. Morgan et al. do not describe the present invention as claimed.

U.S. Pat. No. 5,594,287 issued to David B. Cameron on Jan. 14, 1997, describes a high voltage solid-state relay. Cameron does not describe the present invention as claimed.

U.S. Pat. No. 5,699,218 issued to Andrew S. Kadah on Dec. 16, 1997, describes a solid state/electromechanical hybrid relay device. Kadah does not describe the present invention as claimed.

European Patent Application No. 0 246 064 A2, published on Nov. 11, 1987, for Benjamin Pless et al. describes a two-channel defibrillator device. Pless et al. do not describe the present invention as claimed.

European Patent Application No. 0 326 290 A1, published on Aug. 2, 1989, for Paul E. de Coriolis et al. describes a method and apparatus for applying an asymmetric biphasic exponential waveform counter-shock to the heart. The publication does not describe the present invention as claimed.

European Patent Application No. 0 546 666 A2, published on Jun. 16, 1993, for Carlton B. Morgan et al. describes an electronic energy transfer circuit for delivering a cardiac defibrillation pulse to a patient. Morgan et al. do not describe the present invention as claimed.

None of the above inventions and patents, taken either singly or in combination, is seen to describe the instant invention as claimed.

SUMMARY OF THE INVENTION

The device is a solid-state direct replacement relay and a method for installing and using it to replace the mechanical style relays in the electrical cabinets of a locomotive. The direct replacement relay of the present invention is designed for standard 74 volt locomotive electrical systems, and can be employed in the main and AC electrical cabinets of any locomotive, e.g., light and heavy rail, including, most notably, to replace the mechanical style relays of both the older and even the newer locomotives.

The invention describes the use of conventional solid-state relay (SSR) components to upgrade locomotive relay systems used to operate train controls (run engine, forward, reverse, and lights). With solid-state relays (SSRs), there are no moving parts, and thus, fewer failure points, such as intermittent failures caused by carbonizing of contact tips. Dirty contacts in mechanical relays prevent adequate current flow and cause intermittent failure, which is one of the most prevalent electrical problems in most trains. Solid-state technology is easier on components, because the connection is not made at full voltage, but rather at zero voltage, and it is safe for use in combustible environments. A higher mean time between component failure provides increased reliability, allows simplification of trouble-shooting procedures, and facilitates reuse and modernization of older trains, as well as upgrading of new trains.

In order to operate the older trains with state of the art solid-state relay (SSR) technology that cannot directly handle standard locomotive voltages, one would need an external power supply that would require modification to the original train design and wiring. This invention obviates the need for an external power supply by coupling the SSR to an internal voltage regulator. Without the internal voltage regulator of this invention, one would have to install, in or external to the electrical cabinets, a 5–32 volt power supply to run the control side (signal) of the solid state relay. The internal voltage regulator of the present device reduces or steps down the standard locomotive voltage using a D.C./D.C. converter, which steps 75 volts down to 5–32 volts, and is used to control the SSR. Another object of the invention is to ease the process of troubleshooting failure problems concerning the electrical system of a train. Thus, the use of this device requires no modification to the existing electrical wiring system of a new or old locomotive.

Accordingly, it is a principal object of the invention to employ solid-state technology using a solid-state relay in conjunction with a D.C. to D.C. converter, and in a manner such that it can handle the high voltages inherent in locomotive relay systems.

It is another object of the invention to improve the safety and reliability of the electrical systems of both older and newer locomotives.

It is a further object of the invention to provide SSRs that replace mechanical style relays without any change in the locomotive's wiring.

Still another object of the invention is to ease the process of troubleshooting the electrical system of a train.

It is an object of the invention to provide improved elements and arrangements thereof in an apparatus for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

FIG. 1 is an elevational view of a locomotive showing the location of the main and A.C. electrical cabinets into which are placed solid-state replacement relays according to the present invention.

FIGS. 1A and 1B are enlarged views of the main electrical cabinet and the A.C. cabinet, respectively.

Similar reference characters denote corresponding features consistently throughout the attached drawings.

DETAILED DESCRIPTION OF THE PREFERRED EMBODIMENT

Figure 2A:
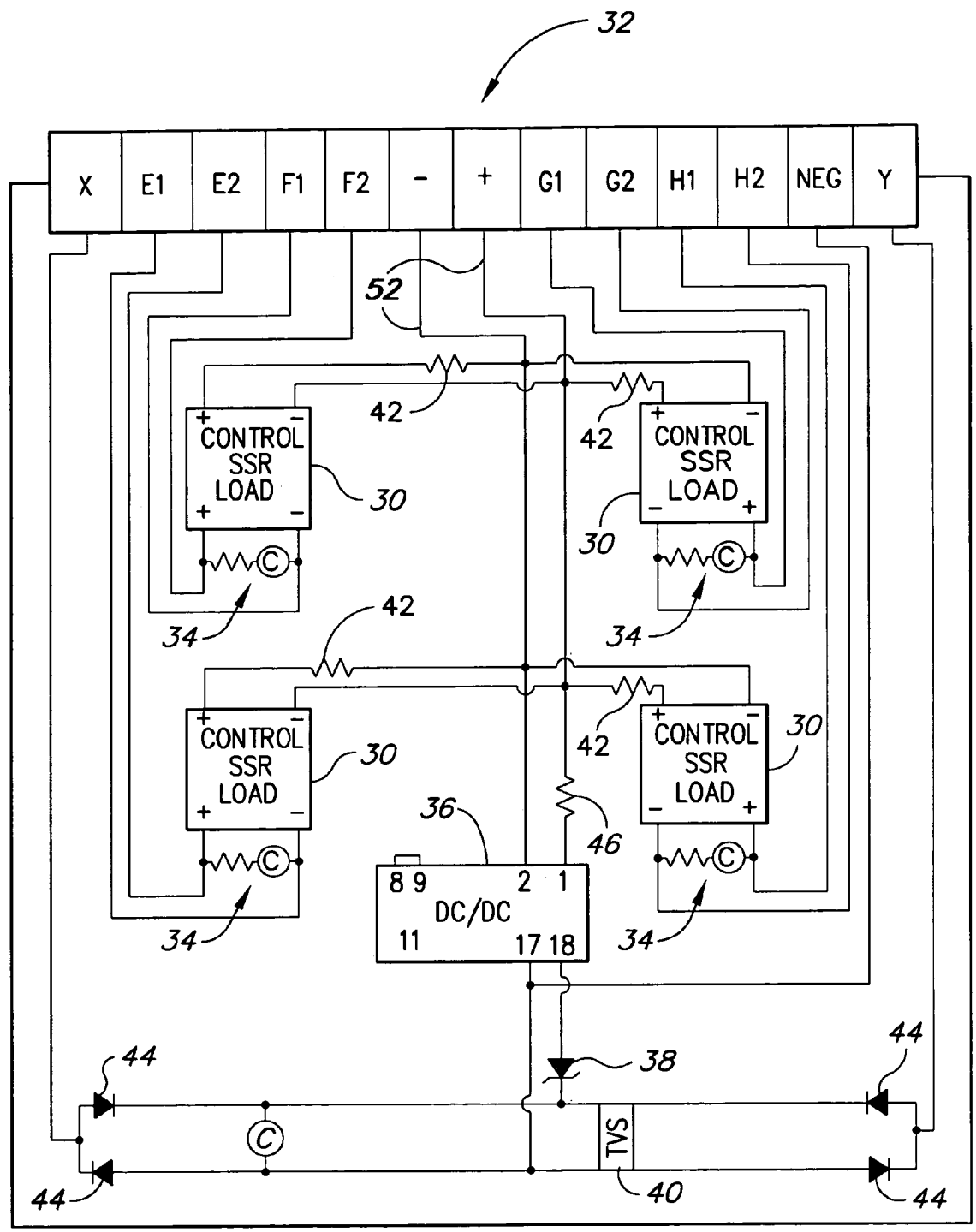
FIG. 2A is a schematic electrical diagram of a normally open (N/O) printed circuit board of the solid-state relay for use in the main cabinet shown in FIG. 1A.

The present invention is a solid-state relay assembly based on a plurality of normally on and/or normally off relays, and a method for installing and/or using the solid-state relay assembly to replace the mechanical style relays in the electrical cabinets of a locomotive. The relay assembly of the present invention allows for direct replacement of mechanical-style locomotive relays without alteration of the existing electrical wiring, and it is designed for direct connection to the following existing relay switching assemblies in locomotive electrical systems operating on: (1) standard 74 volt D.C.; (2) 200 volt, 3 phase A.C.; and (3) 1,000 volt D.C.

FIG. 1 depicts a typical electric-diesel locomotive 12 showing location of the main electrical cabinet 14 and the AC electrical cabinet 16. The main electrical cabinet is typically located adjacent to and directly behind cab 18 of locomotive 12. The front doors of the main electrical cabinet open up to the inside of cab 18. The rear doors of the main electrical cabinet 14 open rearward into the generator compartment 20.

Referring to FIG. 1A, main electrical cabinet 14 houses a majority of the electrical control components including the knife switch and fuse panel 22, circuit breakers 24, and the solid state relay (SSR) assembly 26 that replaces the existing, mechanical-style relays according to the present invention. The main electrical cabinet 14 will house a majority of locomotive 12's relay devices.

Referring to FIG. 1B, AC electrical cabinet 16 generally houses controls for the train's cooling fans, including fan fuses 29. The train's cooling fan contactors, which are typically mechanical, may be replaced according to the present invention by a device disclosed herein, and hereafter termed an AC solid-state relay assembly (AC SSR) 28. Cabinet 16 may also contain a DC SSR assembly 26. Cabinet 16 is usually located in the long hood of locomotive 12. A locomotive can have multiple cooling fans that run at multiple speeds. Each single speed fan would require one AC SSR assembly 28. Each multiple speed fan will have an AC SSR assembly 28 for each speed.

FIG. 2A is a schematic electrical diagram of a normally open printed circuit board (N/O PCB) 32 having connector pins: X, E1, E2, F1, F2, − (negative), + (positive), G1, G2, H1, H2, NEG (negative), and Y to four solid state relay devices (Control SSR Load) 30 with each device having a resistor-capacitor (C) circuit or transient voltage suppressor 34 across each load side. The control sides of devices 30 are connected to each other through a resistor 42 on each. The devices 30 require voltage to close and to remain closed. Therefore, with no applied voltage at the locomotive control, these SSR 30 devices remain open and the D.C./D.C. power converter device 36 is off. Upon application of a locomotive control signal voltage, the applied voltage operates to activate the power converter D.C./D.C. device 36 and activates all four normally open SSR 30 devices to close the normally open circuits. Zener diode 38 and a transient voltage suppressor (TVS) 40 are placed across a series and a parallel circuit respectively containing four diodes 44 connecting connector pin X to connector pin Y as well as to the power converter D.C./D.C. device 36. These connections are conventional "fast-on" terminals in the main and AC electrical cabinets 14 and 16 of the locomotive 12, and will be explained further in the discussion of FIG. 2C. Connector pin 1 of device 36 is connected to the four SSR 30 devices via a resistor 46 and to the connector pin designated + (positive) Connector pin 2 of device 36 is connected to the four SSR devices 30 and to the connector pin − (negative) of the normally open printed circuit board 32. Line 52 from connector pin F2 connects with normally open control SSR load device 30 in the upper left position, and line 52 from the connector pin "−" (minus) connects with contact 2 on the D.C./D.C. power converter device 36. The line 52 also connects with the lines between the upper pair and the lower pair, respectively, of the normally open control SSR load devices 30.

Figure 2B:
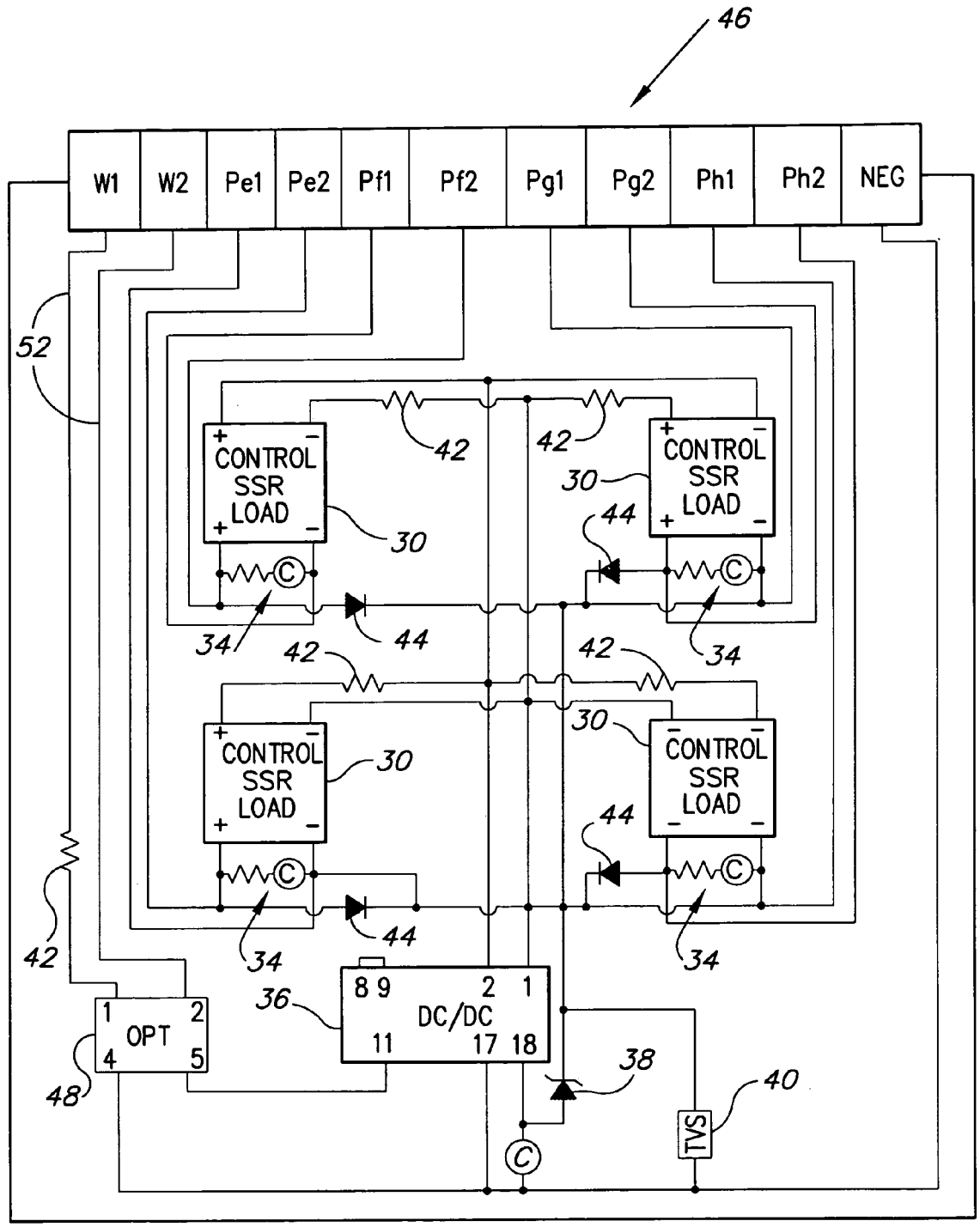
FIG. 2B is a schematic electrical diagram of a normally closed (N/C) printed circuit board of the solid-state relay for use in the main cabinet shown in FIG. 1A.

FIG. 2B is a schematic electrical diagram of a normally closed printed circuit board (N/C PCB) 46 having connector pins: W1, W2, Pe1, Pe2, Pf1, Pf2, Pg1, Pg2, Ph1, Ph2, and NEG (negative), which will be further explained in the discussion of FIG. 2C. The N/C PCB 46 has four solid-state relay devices 30 connected together by their control side wires to pins 1 and 2 of the D.C./D.C. power converter device 36. Each relay device 30 has a transient voltage suppressor 34 containing a capacitor and a resistor connected in parallel to the load side. However, the load sides have diodes 44 connected in parallel to the transient voltage suppressor 34 and in series with the Zener diode 38 and fuse 40 (TVS) which are in parallel to the positive input of D.C./D.C. power converter device 36 with resistor 42 at pin 1 in parallel with inputs of D.C./D.C. power converter device 36. Pins 8 and 9 are connected by a jumper wire. An optical isolator device, OPT 48 is inserted across the lines 52 between the power converter device 36 at pin 11 and to the plus and minus connections W1 and W2, respectively, of the board 46, with a resistor 42 in series with the board 46 and the optical isolator device (OPT) 48 at pins 1 and 2. Pins 5 and 4 of the OPT device 48 are connected to pins 11 and 17, respectively, of the power converter device 36. Pin 18 of the power converter device 36 is connected to a resistor 42 between the upper and lower relay device 30 and to the Zener diode 38 and the fuse, TVS 40. Therefore, with no voltage at any normally closed switch and no locomotive control voltage, each normally closed SSR device 30 remains open. Upon application of voltage at any normally closed load side, some voltage energizes the power converter device 36 to close all the normally closed SSR devices 30 to provide a holding circuit for the SSR device 30. The application of a locomotive control voltage turns off the power converter device 36 and opens all normally closed switches.

Figure 2C:
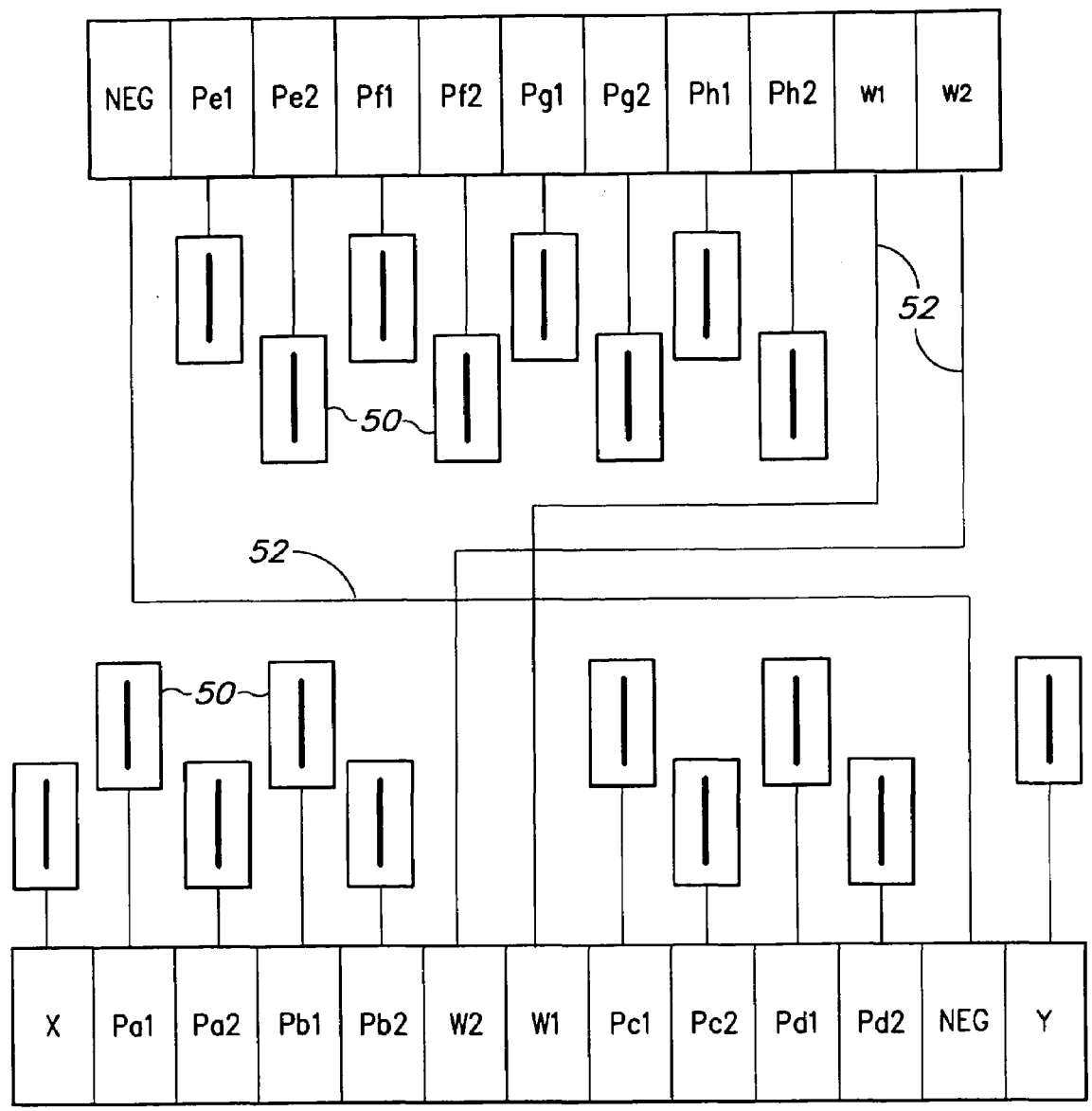
FIG. 2C is a schematic diagram showing pin connections of the solid state relays to the normally open (N/O) printed circuit board of FIG. 2A and the normally closed (N/C) printed circuit board of FIG. 2B.

FIG. 2C is a schematic electrical diagram of the connector pins on the printed circuit boards 32 and 46 illustrated in FIGS. 2A and 2B, respectively. It should be noted that the upper connector pins in each set are reversed in order from the order shown in FIG. 2B. The elongated rectangles 50 enclosing a bar are 0.25 inch "fast-on" connectors. The circuit boards 32 and 46 are connected by the wires 52 and connectors 50. The "fast-on" connectors 50 protrude from the top of the relay housing for connections. The table below explains the functions of the connector pins.

X Locomotive control signal
Y Locomotive control signal
Pa1, Pa2 Normally open switch No. 1
Pb1, Pb2 Normally open switch No. 2
Pc1, Pc2 Normally open switch No. 3
Pd1, Pd2 Normally open switch No. 4
Pe1, Pe2 Normally closed switch No. 1
Pf1, Pf2 Normally closed switch No. 2
Pg1, Pg2 Normally closed switch No. 3
Ph1, Ph2 Normally closed switch No. 4.

The method of replacing a mechanical-style locomotive relay with an SSR assembly 26, comprises preparing a locomotive 12 for servicing, for example, by applying a blue flag signal, hand brakes, etc., then opening the battery knife switch which turns the electrical power off. Next, the relay to be replaced is located and all unmarked wires (from the wire running list) that are connected to either the relay coil on the control side, or to the relay interlock on the load side of the mechanical style relay are marked. The wires and screws from the existing mechanical style relay are then removed, and the existing relay is discarded. Next, the SSR assembly's mounting holes are aligned with the original relay mounting holes, and the SSR assembly 26 is attached into place onto an electrical cabinet 16 such that it is directly connected to wiring carrying standard locomotive voltage. Next, the wires and terminals are inspected for serviceability. The wires are connected to the SSR assembly 26 at the same location as on the old relay and the battery knife switch is closed.

The method of installing an SSR assembly into the electrical cabinets of a locomotive as part of an original locomotive manufacture, occurs in the following manner. First, the locomotive's electrical cabinets 14 and 16 are prepared for installation of the SSR assembly 26. The SSR assembly 26 is installed into the new electrical cabinet (the dual bolt hole pattern on the SSR assembly 26 should fit both old and new style mechanical relay cabinet holes) such that it is directly connected to wiring carrying standard locomotive voltage. Finally, one may proceed with the wiring, because this relay 26 requires no modification to the wire running list.

In greater detail, the method of replacing a mechanical-style locomotive relay with a solid state relay assembly, said mechanical-style locomotive relay having a control side and a load side, comprises the following steps:

(a) preparing a locomotive 12 for servicing;
(b) opening the battery knife switch 22;
(c) locating the relay to be replaced;
(d) marking all unmarked wires that are connected to either a relay coil on the control side or to a relay interlock on the load side of the mechanical-style locomotive relay;
(e) removing said wires from existing mechanical-style locomotive relay;
(f) removing screws and discarding the mechanical-style locomotive relay;
(g) aligning solid state relay assembly mounting holes with original mechanical-style locomotive relay mounting holes and attaching the solid state relay assembly 26 into place onto an electrical cabinet 16 such that it is directly connected to wiring carrying standard locomotive voltage;

(h) inspecting said wires and terminals for serviceability;

(i) returning said wires to the solid state relay assembly 26 at the same location as on the old relay; and (j) closing the battery knife switch 22.

It should be noted that a microcomputer can also be included in the system by reconfiguring the relay switch assemblies illustrated. Newer semi-computerized trains can utilize the present invention without requiring a separate power supply, since the invention has an internal power supply. New trains can include the present invention during production.

It is to be understood that the present invention is not limited to the sole embodiment described above, but encompasses any and all embodiments within the scope of the following claims.

We claim:

1. A locomotive relay assembly comprising:

a plurality of solid-state relay devices, each of said solid state relay devices having a switch, and a signal regulated by a D.C./D.C. power converter, wherein said D.C./D.C. power converter regulates standard locomotive voltage by stepping down said locomotive voltage to a solid-state relay control side voltage;

wherein the opening of said internally self-biased solid-state relay device causes said externally self-biased solid-state relay device to be no longer self-biased, thus opening said externally self-biased solid-state relay device;

wherein each said switch comprises a solid-state relay load side, and each said switch comprises a solid-state relay control side opposite said solid-state relay load side;

wherein said solid-state relay load side, in the presence of said standard locomotive voltage, has a combined normally open switch configuration and a normally closed switch configuration, said normally closed switch configuration comprising an internally self-biased solid-state relay device and an externally self-biased solid-state relay device, wherein said externally self-biased solid-state relay device is self-biased due to electricity running from said load side to said control side through a first D.C./D.C. power converter that runs in parallel with said externally self-biased solid-state relay device;

wherein said solid-state relay control side, in the presence of the electricity passing through a second D.C./D.C. power converter at said standard locomotive voltage, causes said normally open configuration to close, and causes said normally closed configuration to open, wherein the opening of said internally self-biased solid-state relay device causes said externally self-biased solid-state relay device to be no longer self-biased, thus opening said externally self-biased solid-state relay device.

2. The locomotive relay assembly according to claim 1, wherein said solid-state relay load side consists of said normally open configuration only, said locomotive relay assembly further comprising:

an A.C. solid-state relay device operating at standard locomotive A.C. voltage, said A.C. solid-state relay device comprising a solid-state relay load side and a solid-state relay control side regulated by said second D.C./D.C. power converter;

wherein said solid-state relay control side, in the presence of electricity passing through said second D.C./D.C. power converter at said standard locomotive voltage, causes said normally open configuration and said A.C. solid-state relay device to close.

* * * * *